US008875390B2

(12) United States Patent
Lin et al.

(10) Patent No.: US 8,875,390 B2
(45) Date of Patent: Nov. 4, 2014

(54) METHOD OF MANUFACTURING A LAMINATE CIRCUIT BOARD

(71) Applicant: Kinsus Interconnect Technology Corp., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 232 days.

(21) Appl. No.: 13/663,274

(22) Filed: Oct. 29, 2012

(65) Prior Publication Data

US 2014/0115889 A1    May 1, 2014

(51) Int. Cl.
*H01K 3/00* (2006.01)

(52) U.S. Cl.
USPC .................... 29/849; 29/830; 29/831; 29/846

(58) Field of Classification Search
USPC .................. 29/849, 825, 829–831, 846, 876; 156/701, 702, 737, E23.007; 257/272.2
See application file for complete search history.

(56) References Cited

U.S. PATENT DOCUMENTS 7,816,782 B2 * 10/2010 Murai et al. .................. 257/702
2006/0016553 A1 * 1/2006 Watanabe .................. 156/272.2

* cited by examiner

Primary Examiner — Thiem Phan
(74) Attorney, Agent, or Firm — Lin & Associates IP, Inc.

(57) ABSTRACT

A method of manufacturing a laminate circuit board which includes the sequential steps of metalizing the substrate to form the base layer, forming the first circuit metal layer, forming at least one insulation layer and at least one second circuit metal layer interleaved, removing the substrate, forming the support frame and forming the solder resist is disclosed. The laminate circuit board has a thickness less than 150 μm. The support frame which does not overlap the first circuit metal layer is formed on the edge of the base layer by the pattern transfer process after the substrate is removed. The base layer formed of at least one metal layer is not completely removed. The support frame provides enhanced physical support for the entire laminate circuit board without influence on the electrical connection of the circuit in the second circuit metal layer, thereby solving the warping problem.

6 Claims, 7 Drawing Sheets

METHOD OF MANUFACTURING A LAMINATE CIRCUIT BOARD

BACKGROUND OF THE INVENTION

1. Field of the Invention

The present invention generally relates to a method of manufacturing a laminate circuit board, and more specifically to forming a support frame used to enhance the mechanical strength and stability of the entire board.

2. The Prior Arts

Please refer to FIG. 1. The laminate circuit board 500 in the prior arts generally comprises a first circuit metal layer 21, at least one insulation layer 31, at least one second circuit metal layer 25 and a solder resist 50.

The insulation layer 31 is provided on the first circuit metal layer 21 to cover the upper surface of the first circuit metal layer 21. The lower surface of the first circuit metal layer 21 and the first insulation layer 31 forms a co-plane, on which part of the first circuit metal layer 21 is exposed. The lowermost one of the at least one second circuit metal layer 25 is provided on the first insulation layer 31 and fills up at least one openings 35 of the first insulation layer 31 to connect with the first circuit metal layer 21. The uppermost one of the at least one second circuit metal layer 25 is not covered by any insulation layer 31.

The solder resist 50 is provided on the co-plane, the uppermost second circuit metal layer 25 and the uppermost insulation layer 31 to cover part of the first circuit metal layer 21 and part of the uppermost second circuit metal layer 25.

However, one of the shortcomings of the laminate circuit board in the prior arts is that it is difficult to manufacture the board which meets the upcoming requirements for more compact, lighter and smaller electronic products because the board needs to be much thinner with a result that the board easily warps due to insufficient strength during the subsequent processes, such as chip connection, packaging or shipment. Moreover, the circuit layer of the board is easily peeled off or short-circuited and other function failure problems may even happen. Therefore, it is desired to provide the method of manufacturing the laminate circuit board which has more mechanical strength and stability and meanwhile sustains the original function so as to solve the above-mentioned problems in the prior arts.

SUMMARY OF THE INVENTION

A primary objective of the present invention is to provide a method of manufacturing a laminate circuit board, which comprises metalizing a substrate, forming a first circuit metal layer, performing an additional formation process at least one time, removing the substrate, forming a support frame, and forming a solder resist.

The substrate is metalized by forming at least one metal layer on the smooth surface of the substrate as a base layer. The first circuit metal layer is formed on the base layer through the pattern transfer process. The additional formation process performed first time is implemented by forming an insulation layer on the first circuit metal layer and a second circuit metal layer on the insulation layer. The insulation layer has at least one opening which is filled by the second circuit metal layer such that the second circuit metal layer connects with the first circuit metal layer. Similarly, other additional insulation layer(s) and second circuit metal layer(s) are sequentially formed to stack together. Then, the substrate is removed to expose the base layer.

The support frame is formed by first forming a photo resist pattern on an edge of the base layer which does not overlap the first circuit metal layer and subsequently performing at least one itching process to remove part of the base layer which is not masked by the photo resist pattern. The solder resist is formed on an uppermost insulation layer, an uppermost second circuit metal layer and a co-plane formed by the first circuit metal layer and the lowermost insulation layer to mask part of the first circuit metal layer and part of the uppermost second circuit metal layer. Thus, the laminate circuit board is manufactured and has a thickness less than 150 μm.

The method of the present invention does not completely remove the base layer, but configures the support frame on the edge of the co-plane without influence on the circuit connection so as to prevent the resulting laminate circuit board from warping.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
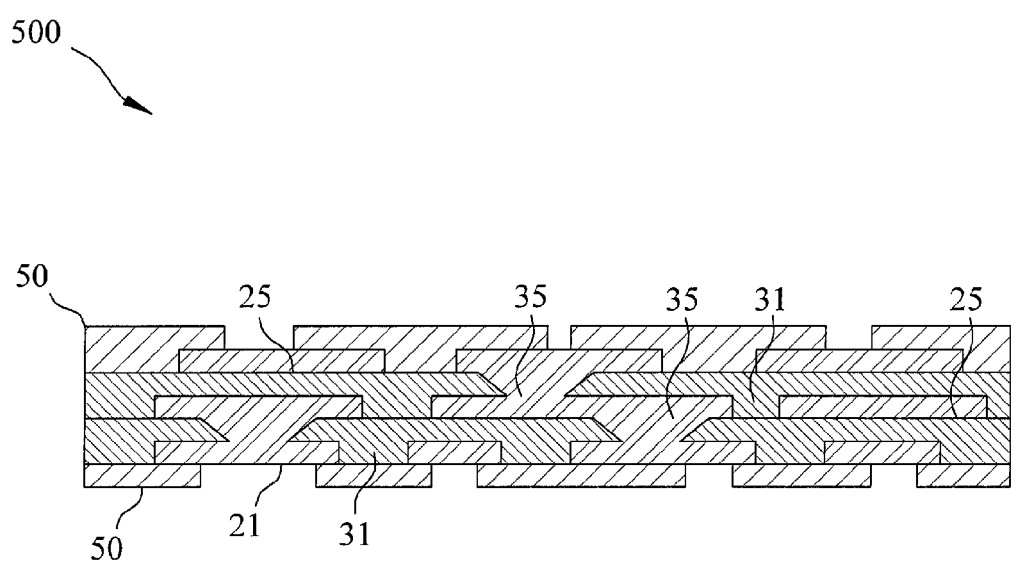
FIG. 1 schematically shows a diagram to illustrate the laminate circuit board in the prior arts.
Figure 2:
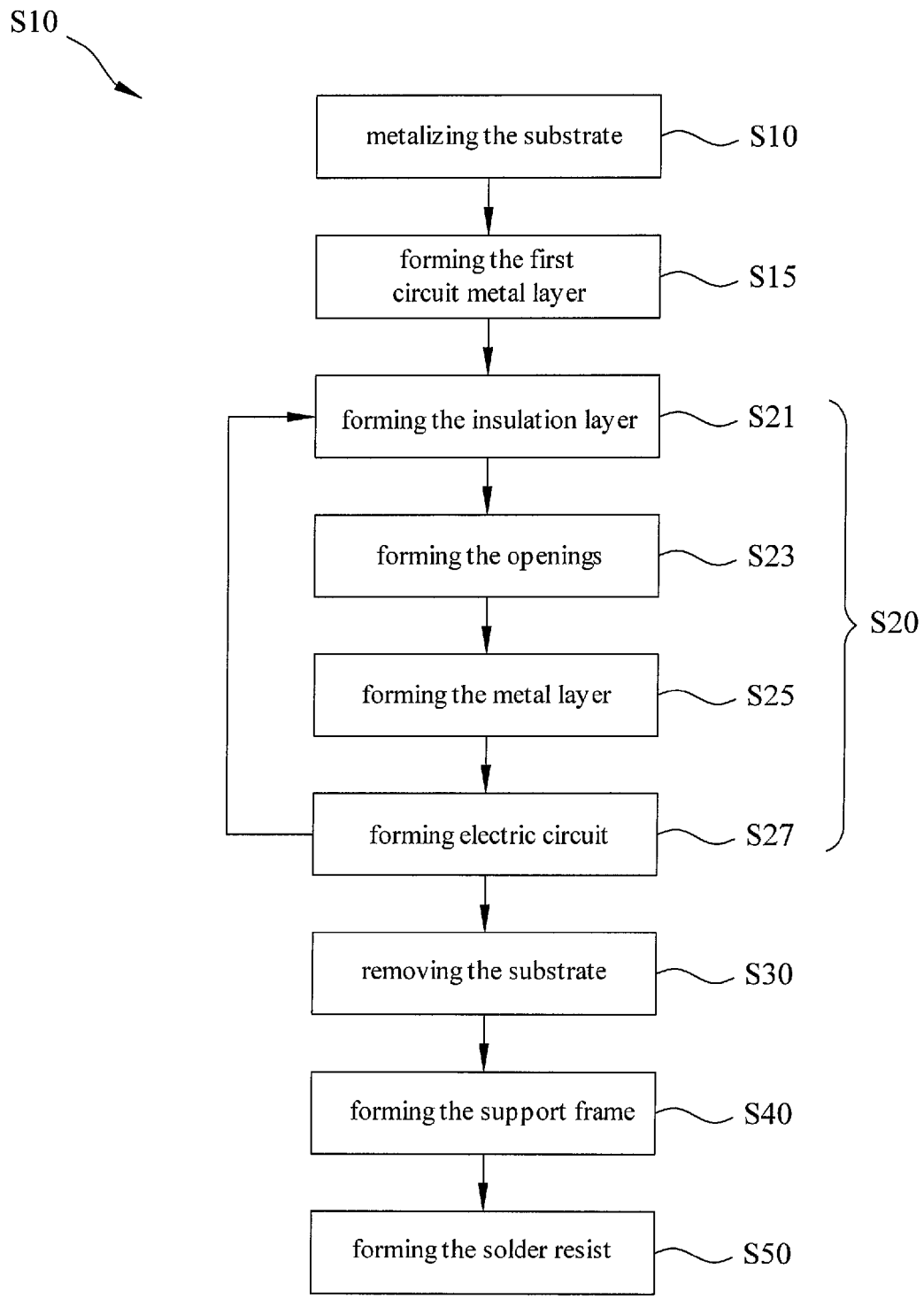
FIG. 2 shows a flow diagram of the method according to the present invention.

Please refer to FIG. 2 for illustrating the sequential processes of the method of manufacturing a laminate circuit board according to the present invention. As shown in FIG. 2, the method of the present invention comprises the steps of metalizing the substrate S10, forming the first circuit metal layer S15, performing at least one time an additional formation process S20, removing the substrate S30, forming the support frame S40 and forming the solder resist S50.

Figure 3A:
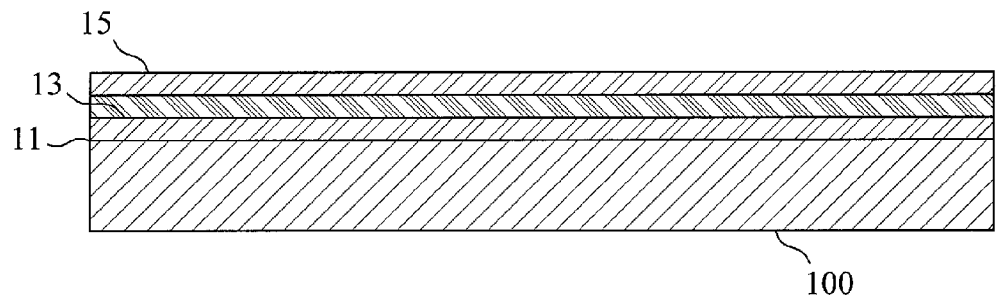
FIGS. 3A to 3K show the corresponding schematic diagrams to illustrate the respective processes of the method according to the present invention.
Figure 3B:
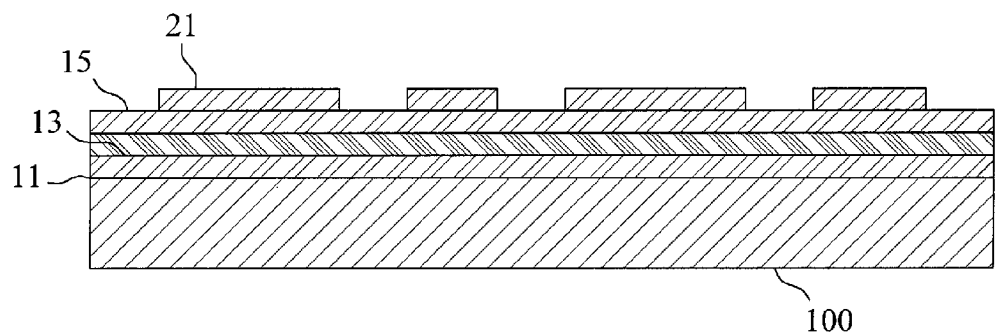

Also refer to FIGS. 3A to 3K for the respective processes of the method shown in FIG. 2. First, as shown in FIG. 3A, the step S10 is implemented by forming a base layer on a smooth surface of the substrate 100. The base layer generally consists of at least one metal layer, such as a first copper layer 11, a nickel layer 13 and a second copper layer 15 sequentially stacked upwards. The substrate 100 is made of a stainless steel plate, a BT (bismaleimide triazime) substrate or a FR4 glass fiber substrate. As shown in FIG. 3B, the step 15 forms a first metal layer on the base layer and patterns the first metal layer to form a first circuit metal layer 21 with a first circuit pattern through the pattern transfer process.

Figure 3C:
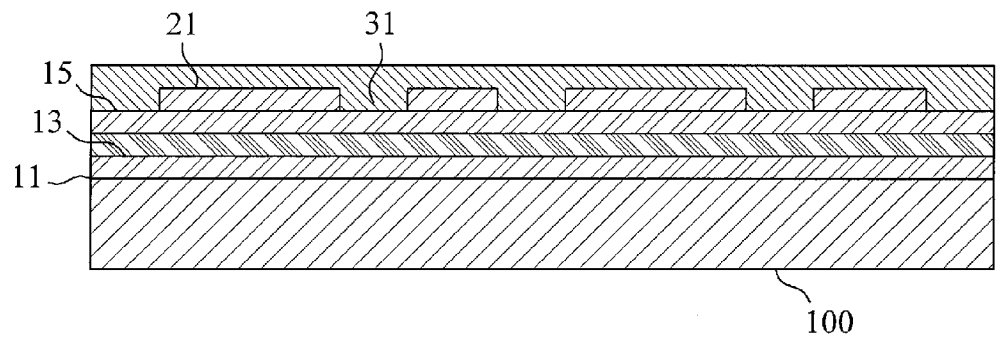
Figure 3D:
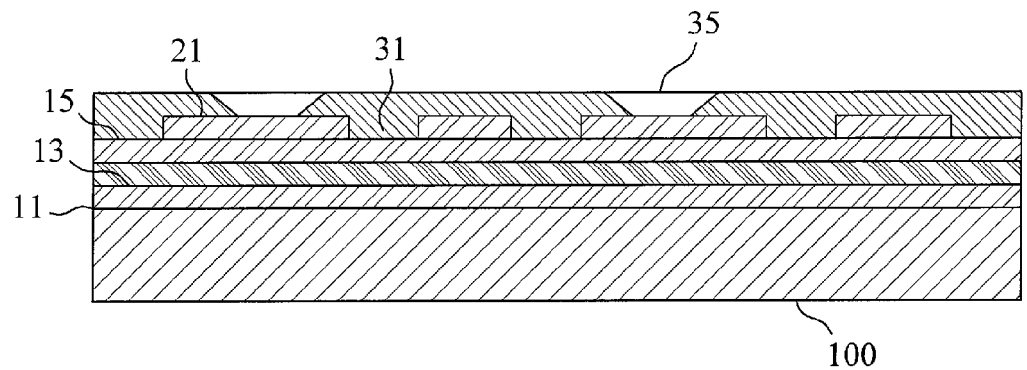

The step S20 performs the additional formation process at least one time, which comprises the steps of forming the insulation layer S21, forming the at least one opening S23, forming the second metal layer S25 and forming the second circuit metal layer S27. The step S21 forms the insulation layer 31 on the substrate 100 and the first circuit metal layer 21 as the lowermost insulation layer to completely cover the upper surface of the substrate 100 and the upper surface of the first circuit metal layer 21, as shown in FIG. 3C. Then the step S23 illustrated in FIG. 3D forms at least one opening 35 in the insulation layer 31 respect to the first circuit metal layer 21 so as to expose part of the first circuit metal layer 21.

Figure 3E:
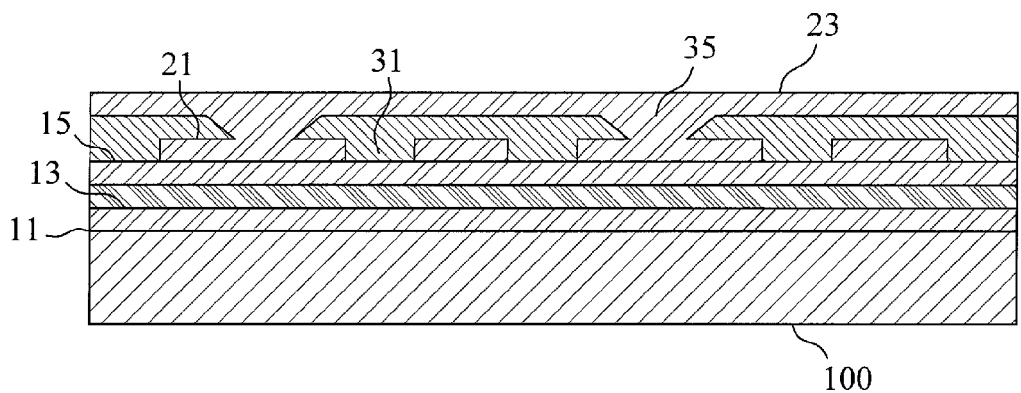
Figure 3F:
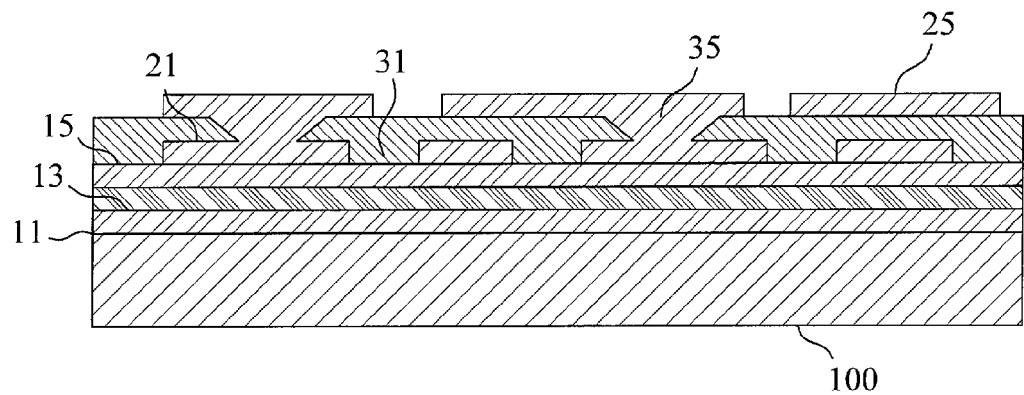

As shown in FIG. 3E, the step 25 forms the second metal layer 23 on the insulation layer 31 and fills up the at least one opening 35 in the insulation layer 31. Subsequently, the step 27 illustrated in FIG. 3F forms the second circuit metal layer 25 with a second circuit pattern by removing part of the second metal layer 23 through the pattern transfer process.

Figure 3G:
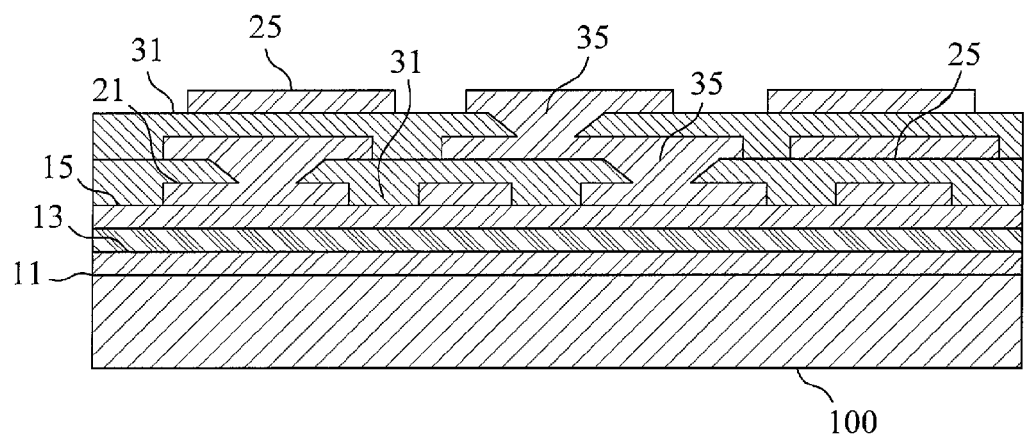

The above-mentioned steps S21 to S27 are performed at least one time in the present invention to additionally form at least one insulation layer 31 and at least one second circuit metal layer 25 interleaved. For clearly illustrating the present invention, the steps S21 to S27 are performed two times in this embodiment as shown in FIG. 3G such that two nearest second circuit metal layers 25 sandwich one corresponding insulation layer 31 and connect with each other via the opening 35 in the insulation layer 31 which is filled by the upper one of the two nearest second circuit metal layers 25. It should be noted that, the uppermost second circuit metal layers 25 is not covered by the insulation layer 31.

Figure 3H:
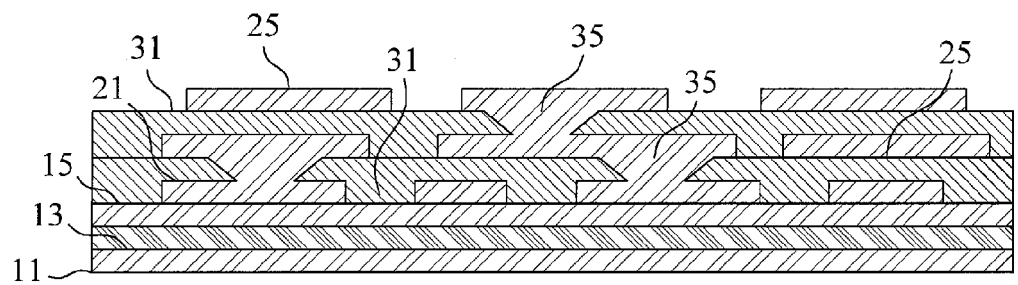
Figure 3I:
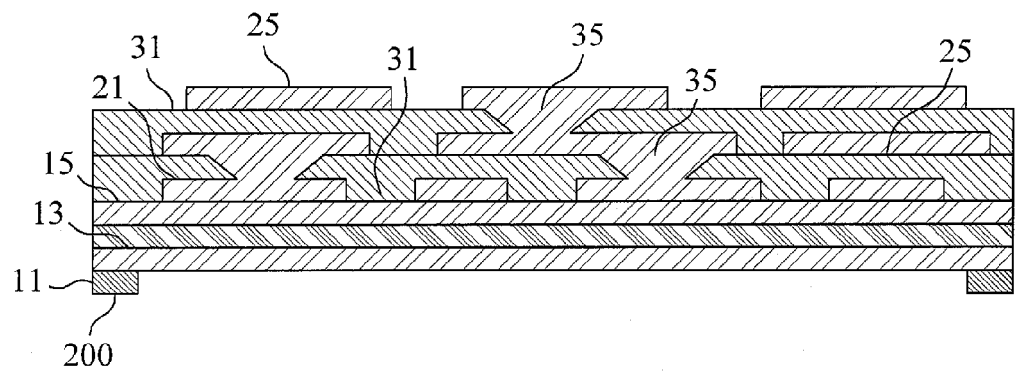
Figure 3J:
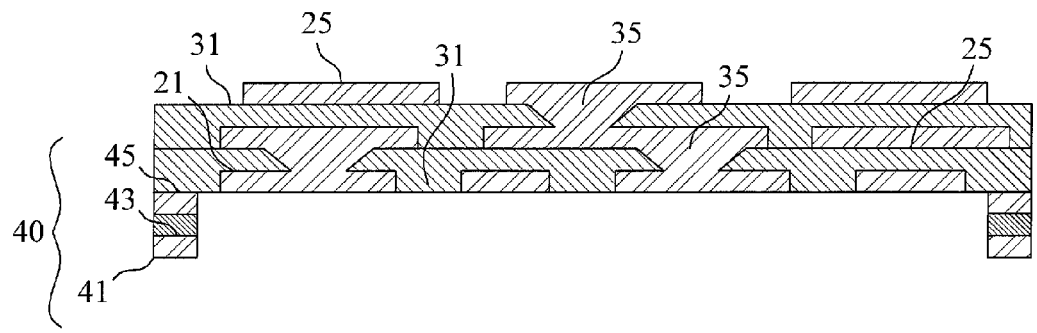

The step S30 shown in FIG. 3H is performed to remove the substrate 100 to expose the first copper layer 11. And, FIGS. 3I to 3J respectively illustrate the processes in the step 40. First the step 40 forms the photo resist pattern 200 on the edge of the first copper layer 11, and the photo resist pattern 200 does not overlap the first circuit metal layer 21, as shown in FIG. 3I. Then the itching process is performed at least one time to remove the parts of the first copper layer 11, the nickel layer 13 and the second copper layer 15 which are not masked by the photo resist pattern 200 to expose the first circuit metal layer 21 and form the first copper layer pattern 41, the nickel layer pattern 43 and the second copper layer pattern 45 by patterning the first copper layer 11, the nickel layer 13 and the second copper layer 15, respectively. Finally, the photo resist pattern 200 is removed to form the support frame 40 on the edge consisting of the first copper layer pattern 41, the nickel layer pattern 43 and the second copper layer pattern 45, as shown in FIG. 3J.

Figure 3K:
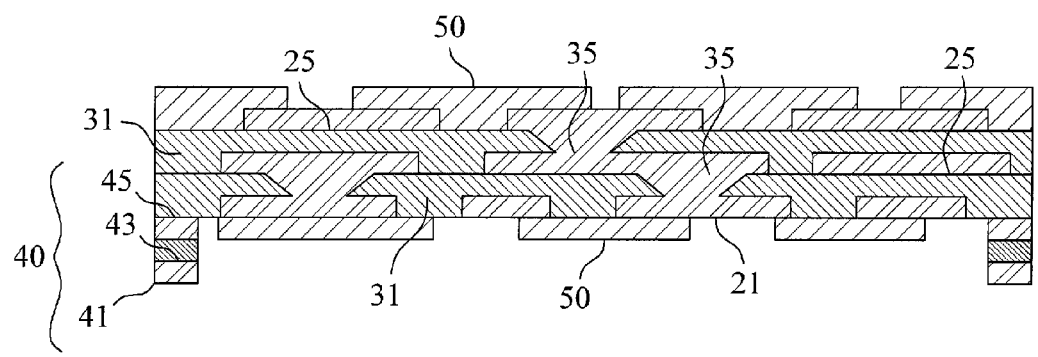

Finally, FIG. 3K schematically illustrates the step 50 which forms the solder resist 50 on the uppermost insulation layer 31, the uppermost second circuit metal layer 25 and the co-plane which is formed by the first circuit metal layer 21 and the insulation layer 31 and previously in contact with the substrate 100. The solder resist 50 is used to mask part of the first circuit metal layer 21 and the uppermost second circuit metal layer 25. Therefore, the resulting laminate circuit board is manufactured and has a thickness less than 150 μm.

One aspect of the method according to the present invention is that the base layer formed of at least one metal is not completely removed, but the support frame is provided on the edge of the co-plane formed by the insulation layer and the first circuit metal layer without influence on the circuit connection. Therefore, the support frame provides the entire board with enhanced physical support, thereby preventing the board from warping.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing a laminate circuit board, comprising steps of:
    metalizing a substrate by forming at least one metal layer on a smooth surface of the substrate as a base layer;
    forming a first circuit metal layer on the base layer through a pattern transfer process;
    performing an additional formation process at least one time which forms an insulation layer and a second circuit metal layer on the insulation layer, wherein each insulation layer having at least one opening which is filled by the corresponding second circuit metal layer on the insulation layer such that the second circuit metal layer on a lowermost insulation layer as a lowermost second circuit metal layer connects with the first circuit metal layer and meanwhile two nearest second circuit metal layers which sandwich the corresponding insulation layer connect with each other;
    removing the substrate to expose the base layer;
    forming a support frame by forming a photo resist pattern on an edge of the base layer which does not overlap the first circuit metal layer and subsequently performing at least one itching process to remove part of the base layer which is not masked by the photo resist pattern; and
    forming a solder resist on an uppermost insulation layer, an uppermost second circuit metal layer and a co-plane which is formed by the first circuit metal layer and the lowermost insulation layer to mask part of the first circuit metal layer and part of the uppermost second circuit metal layer so as to form the laminate circuit board which has a thickness less than 150 μm.

2. The method as claimed in claim 1, wherein the base layer comprises at least a first copper layer, a nickel layer and a second copper layer, which are sequentially stacked upwards.

3. The method as claimed in claim 2, wherein the support frame comprises a first copper layer pattern, a nickel layer pattern and a second copper layer pattern, which are formed by patterning the first copper layer, the nickel layer and the second copper layer, respectively.

4. The method as claimed in claim 1, wherein the substrate is made of a stainless steel plate, a BT (bismaleimide triazime) substrate or a FR4 glass fiber substrate.

5. The method as claimed in claim 1, wherein the additional formation process which is first performed comprises:
    forming the lowermost insulation layer on the substrate and the first circuit metal layer to completely cover an upper surface of the substrate and an upper surface of the first circuit metal layer;
    forming the at least one opening in the lowermost insulation layer with respect to the first circuit metal layer;
    forming a lowermost second metal layer on the lowermost insulation layer; and
    forming a lowermost second circuit metal layer with a second circuit pattern by removing part of the lowermost second metal layer through the pattern transfer process.

6. The method as claimed in claim 5, wherein the additional formation process which is performed a second time comprises:
    forming an another insulation layer on the lowermost second metal layer to completely cover an upper surface of the lowermost second metal layer;

forming the at least one opening in the another insulation layer with respect to the lowermost second circuit metal layer to expose part of the lowermost second circuit metal layer;

forming an another second metal layer on the another insulation layer; and forming an another second circuit metal layer with an another second circuit pattern by removing part of the another second metal layer through the pattern transfer process.

\* \* \* \* \*